United States Patent [19]
Warner et al.

[11] 3,947,609
[45] Mar. 30, 1976

[54] METHOD FOR COATING METALLIC STRIPS

[75] Inventors: Leadom A. Warner, Sayre; Kenneth Shaner, Luthers Mills, both of Pa.

[73] Assignee: GTE Sylvania Incorporated, Stamford, Conn.

[22] Filed: Sept. 18, 1974

[21] Appl. No.: 507,203

Related U.S. Application Data

[62] Division of Ser. No. 289,180, Sept. 14, 1972, Pat. No. 3,875,900.

[52] U.S. Cl. .................. 427/68; 427/372; 427/435
[51] Int. Cl.² ......................................... H01J 29/00
[58] Field of Search ............... 117/34, 81, 127, 164; 427/435, 372, 346, 68

[56] References Cited
UNITED STATES PATENTS

| | | | |
|---|---|---|---|
| 3,159,488 | 12/1964 | O'Connor et al. | 117/34 |
| 3,303,044 | 2/1967 | Fenley | 117/34 |
| 3,307,214 | 3/1967 | Belvedere | 117/34 |
| 3,475,193 | 10/1969 | Takenaka et al. | 117/34 |

*Primary Examiner*—Bernard D. Pianalto
*Attorney, Agent, or Firm*—Norman J. O'Malley; Donald R. Castle; Lawrence R. Fraley

[57] ABSTRACT

There is disclosed a method for simultaneously applying a relatively thin coating of photosensitive material to both sides of a continuously moving horizontally aligned metallic strip wherein the strip is submerged within a tank assembly having the material therein. The strip is then withdrawn at a predetermined rate and in a substantially vertical direction from the tank assembly through a drying chamber having at least one pair of heater members positioned therein.

3 Claims, 4 Drawing Figures

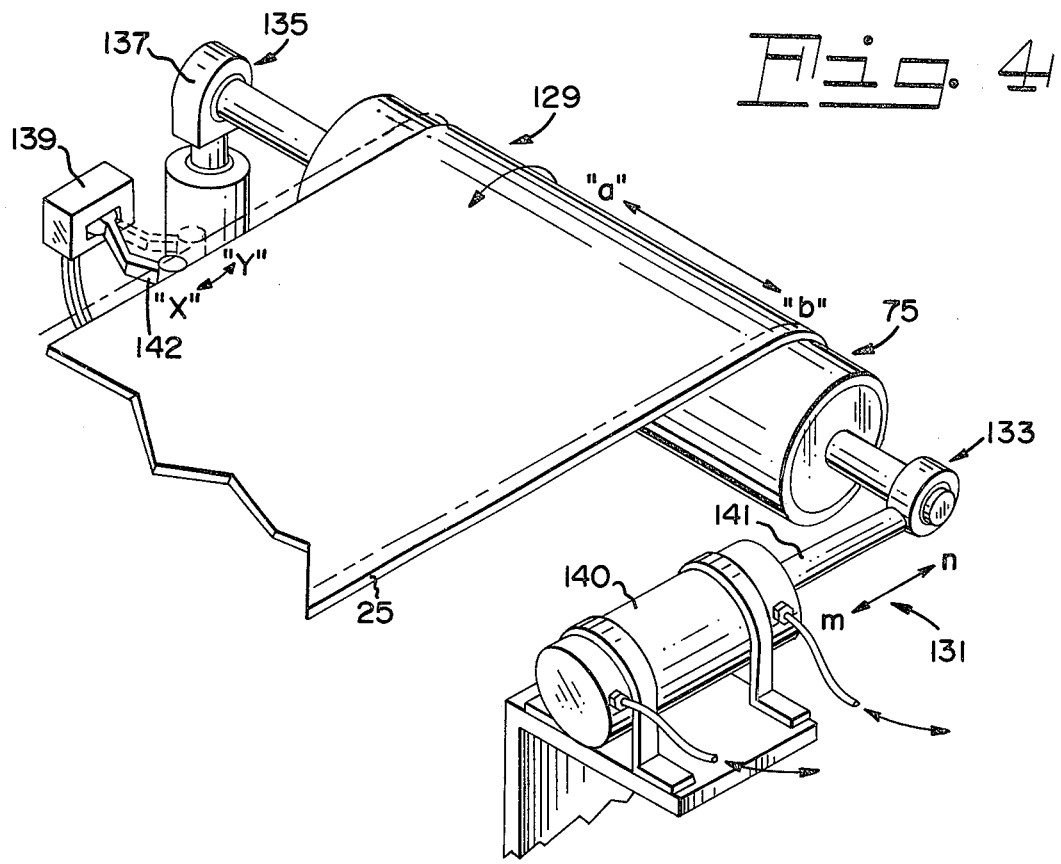

3,947,609

METHOD FOR COATING METALLIC STRIPS

CROSS REFERENCE TO OTHER APPLICATIONS

This application is a division of Ser. No. 289,180, filed September 14, 1972 and now U.S. Pat. No. 3,875,900, and assigned to the assignee of the present invention.

The apparatus as set forth in this application is also applicable to the method described in co-pending application Ser. No. 387,762, filed Aug. 13, 1973, and assigned to the assignee of the present invention.

BACKGROUND OF THE INVENTION

This invention relates to coating methods and particularly to coating horizontally aligned moving metallic strips.

More specifically, this invention relates to applying relatively thin coatings to both sides of a moving horizontally aligned metallic strip and to drying the coatings thereon.

Even more specifically, this invention relates to applying and drying thin coatings of photosensitive material to both sides of a metallic strip to eventually be utilized as aperture masks in color television cathode ray tubes.

As it is known in the art, most color television cathode ray tubes employ an apertured metallic mask positioned within the tube to aid in directing the electron beams emitted from the tube's electron guns in striking the tube screen. These beams excite in a pre-established manner the pattern of cathodoluminescent materials positioned on the screen to produce a desired color. A typical apertured mask contains hundreds of thousands of openings therein for this purpose. As can be appreciated, producing masks of this variety is a highly complicated and precision demanding process.

Previous methods for manufacturing apertured masks for color television tubes have substantially included coating a thin metallic strip with a photosensitive material, drying the material thereon, photoprinting a desired pattern on the strip, removing selective portions of the coating from the strip, and thereafter subjecting the strip to an etching step whereby the unprotected metal surfaces are etched through.

Heretofore, the application and dryig of the photosensitive coatings on the metallic strip have been achieved while the strip was in a substantially vertical position. As described in detail in U.S. Pat. No. 2,791,514 the coating material is applied in liquid form to the top marginal edge of the thoroughly cleaned metallic web and allowed to flow downward freely over both faces of the webbing. This is accomplished as the metal webbing travels edgewise through a coating station.

While this and similar methods have resulted in a coating being applied to both faces of a metallic strip, the uniformity of thicknesses of these coatings across the entire width of the strip has remained questionable. On far too many occasions, the coating thickness at the bottom of the strip proved greater than that at the top, most usually as a result of thicker concentrations of material accumulating at the bottom and not being able to dry at a sufficient rate with those along the upper surfaces. As can be appreciated, in precisely defined articles such as aperture masks, this difference in thicknesses can result in misalignment of the photoprinters during the photoprinting phase to thereby produce an uneven pattern of exposed or unexposed areas. Additionally, nonuniform thicknesses of the coatings can result in unequal rates of etching of the metal during the etching phase, therby resulting in some openings being larger than others.

It is believed, therefore, that a method for applying relatively thin uniform coatings to both sides of a moving substantially horizontally aligned metallic strip which would overcome the above cited disadvantages of prior art methods would constitute an advancement in the art.

OBJECTS AND SUMMARY OF THE INVENTION

It is therefore, an object of this invention to provide a apparatus method for applying relatively thin coatings to both sides of moving metallic strip.

It is a further object of this invention to provide a method for applying said coatings which obviates the above-cited disadvantages of prior art methods.

It is a still further object of this invention to provide a method for coating moving metallic strips as said strips move through the apparatus in a substantially horizontally aligned relationship.

An even further object of this invention is to provide a method for applying relatively thin coatings of photosensitive material to both sides of metallic strips to be eventually utilized in the production of aperture masks for color television cathode ray tubes.

In accordance with one aspect of the present invention, there is provided a method for applying the above coatings to horizontally aligned moving strips comprising the steps of supplying a strip, applying a thin coating to both sides of the strip by submerging the strip within a tank assembly having coating material therein, continuously agitating the surface of the coating material in the area immediately surrounding the strip as the strip exits the tank, withdrawing the strip from the tank, and accumulating the strip after the coatings have dried thereon.

BRIEF DESCRIPTION OF THE DRAWINGS

FIG. 4 is an isometric view of the alignment means utilized in one embodiment of the present invention.

DETAILED DESCRIPTION OF THE PREFERRED EMBODIMENTS

For a better understanding of the present invention, together with other and further objects, advantages, and capabilities thereof, reference is made to the following disclosure and appended claims in connection with the above-described drawings of the invention.

Figure 1:
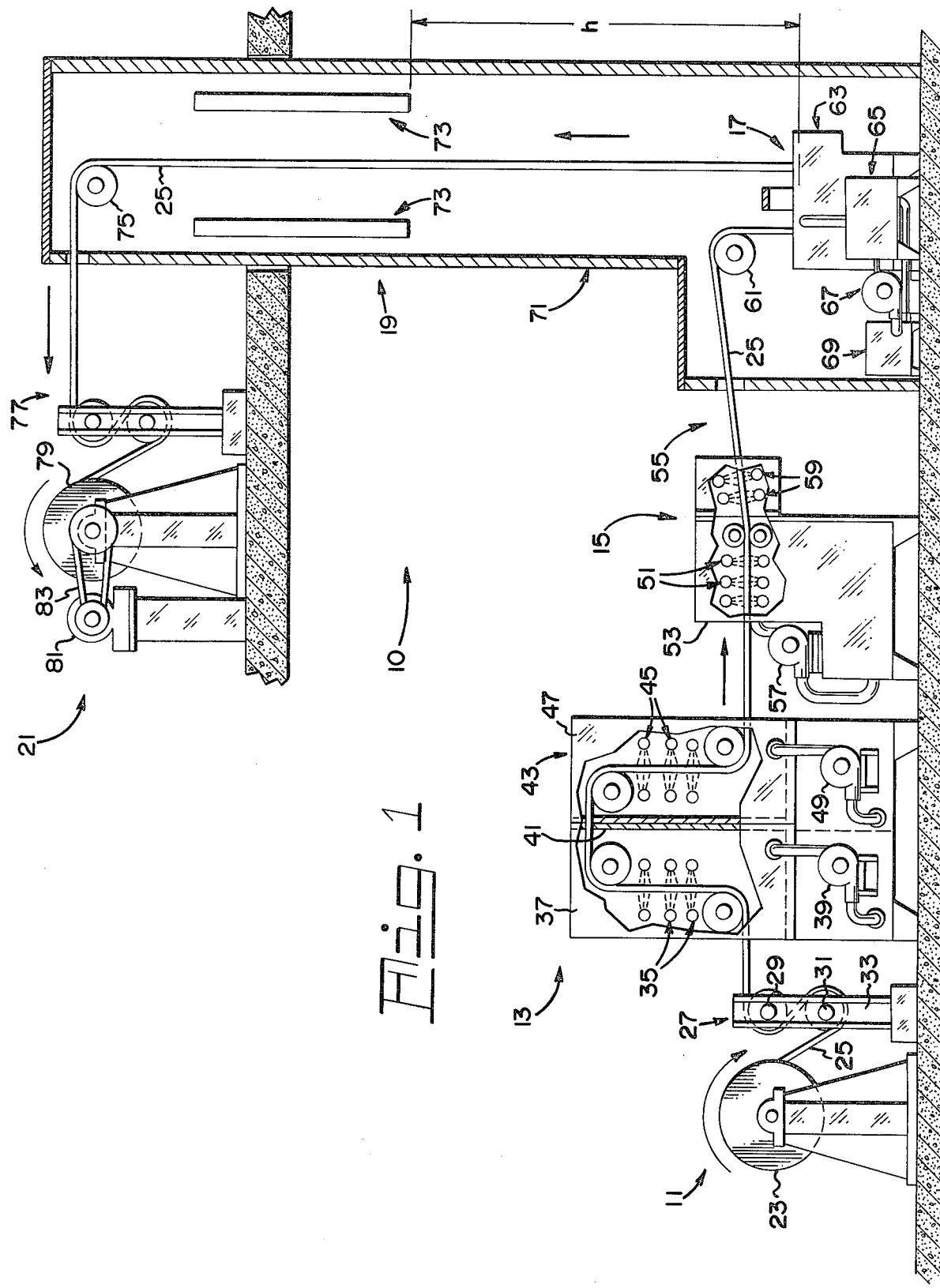
FIG. 1 is a side elevational view of the coating apparatus of one embodiment of the present invention.

In FIG. 1, one embodiment of a coating apparatus 10 in accordance with the present invention is illustrated and shown to comprise a supply means 11, preparatory cleaning means 13, surface preparation means 15, coating means 17, drying means 19, and a power driven take-up means 21. More specifically, supply means 11 comprises a payoff spool member 23 which contains several windings of a metallic strip 25 thereon. The strip is fed off in a direction shown to a payoff control station 27 which operates in conjunction with spool 23 to prohibit slackening and consequently possible deforming of the strip at this position of the apparatus. Control station 27 comprises a pair of substantially vertically aligned roller members 29 and 31 supported in an upright frame 33. It is understood that spool 23 and control station 27 are but illustrative examples of several substantially similar operating devices known in the art which could perform these functions and are not intended to restrict the concept of the present invention in any way.

Should the coating apparatus 10 be employed in the manufacture of aperture masks for color television cathode ray tubes or similar relatively thin and fragile articles, it is often desirable to protect the wound strip with backing paper or similar material. This paper is interwound onto spool 23 between each layer of strip 25 by the manufacturer of the unfinished strip. It is, therefore, necessary to provide a means for unwinding this paper concurrently with the unwinding of the strip. To do so, a paper winder (not shown) may be simply attached to frame 33 above roller member 29. This winder, several varieties of which are known in the art, may be electrically driven or mechanically linked to the rotating spool 23 or rollers 29 and 31.

From control station 27 the strip 25 is fed to preparatory cleaning means 13 which is shown to comprise a plurality of stationary sprayer members 35 positioned within chamber 37 and along both sides of strip 25. Sprayers 35 are supplied with cleaning solution by pump 39 which recirculates solution from a collection reservoir positioned within the base of chamber 37. As the solution strikes the surface of strip 25 passing therebetween, it falls to the reservoir below and is recycled. Although almost any of the well known industrial degreasers can be utilized as a cleaning solution, Applicants prefer a caustic solution comprised basically of sodium hydroxide and available from Fremont Industries, Shakopee, Minnesota, under the trade name Fremont 61. Cleaning means 13 serves to remove any residue or other contaminants which may have accumulated on strip 25 either during manufacture or packaging.

Strip 25 is then passed through opening 41 in a wall of chamber 37 where it enters rinsing means 43 comprised of several stationary spraying nozzles 45. Nozzles 45 are positioned within a housing 47 adjoining chamber 37 and are adapted for providing a spray onto the strip's surfaces as they pass therebetween. Similar to the operation of cleaning means 13, the rinsing solution striking the strip surfaces falls to a reservoir located in the bottom of housing 47 where it is recycled to nozzles 45 by pump 49. The main purpose of rinsing means 43 is to substantially remove any of the preparatory cleaning material left on strip 25 from the previous operation. When utilizing the previously described caustic or chemically similar solutions, water is sufficient to use as a rinse.

From rinsing means 43, strip 25 passes to surface preparation means 15 which is shown to comprise a plurality of individual spray assemblies 51 located within housing 53. Preparation means 15 prepares the surfaces of strip 25 for the coatings to be applied thereto by providing a spray of echtant material, i.e. hydrochloric, nitric, or sulfuric acid. Basically, this material roughens the surfaces of strip 25, thereby increasing their adhering ability for a subsequent coating. After surface preparation means 15, strip 25 is subjected to another water rinsing means 55 to remove the echtant material therefrom. As in the case of preparatory cleaning means 13 and rinsing means 43, the solutions used for the echtant material in surface preparation means 15 and the water in rinsing means 55 may be recycled utilizing a pumping apparatus or similar device. Pump 57 recycles echtant solution in housing 53 from a reservoir in the base of the housing back to spray assemblies 51 while a similar recycling apparatus (not shown) returns water to nozzles 59 in rinsing means 55.

having completed the rinsing cycle to remove the echtant, the strip is now substantially prepared to receive the prescribed coatings. To do so, strip 25 is passed over roller 61 and then in a substantially downward direction to coating means 17, shown to comprise a tank assembly 63, overflow reservoir 65, circulatory means 67, and filtering means 69. Additional components of coating means 17, to include a submerging means and coating surface agitating means, will be described in reference to FIGS. 2 and 3. Additionally, a more detailed explanation of the operating procedure of the coating means will be provided with description of these figures.

Strip 25 is withdrawn from coating means 17 in a substantially vertical direction within a chamber 71 of drying means 19. Positioned within chamber 71 is a pair of opposed heater assemblies 73 between which strip 25 is vertically passed. Heater assemblies 73 are spaced apart from strip 25 and at a height from coating means 17 in accordance with the chemical formulations of the coating material employed, as will be explained. The heating assemblies preferred by Applicants are low temperature infra-red type heaters, rated at approximately 750 watts per square foot and uniformly emitting radiation at a wavelength of 3 microns. Similar type heaters have also been utilized with varying degrees of success, among these, pairs of 250 watt heat lamps. Although only one pair of heater assemblies is illustrated in FIG. 1, this is not intended to constitute a restriction to the proposed invention in that additional pairs may also be used concurrently.

The coating material utilized by Applicants is one well known in the art of manufacturing color television aperture masks, that being dichromated glue, often referred to in the industry as "fishglue". This photosensitive material is preferred to have a specific gravity of between 0.962 and 1.040. Applicants have found that glues within these particular specific gravity ranges may be withdrawn at suitable production rates, usually between 8 and 45 inches per minute, permitted to drain for an established period on the metallic strip, and then subjected to the heater assemblies.

As illustrated in FIG. 1, coating apparatus 10 occupies at least two floor levels during operation. On the first level are positioned the supply means 11, preparatory cleaning means 13, surface preparation means 15, and coating means 17. On the second or upper level is positioned the power driven take-up means 21. Located substantially between the first and second level is drying means 19, positioned at a height (dimension h) approximately 7 feet above the surface of the coating material in tank assembly 63. It has been found that providing this spacing between the coating material surface and the heater assemblies permits a sufficient time period for the coating material on the strip to settle downwardly as the strip proceeds upward at the predescribed rates. This period of uniform downward drainage, coupled with the drying heat from the heater assemblies results in smooth and uniformly dimensioned coatings being formed on both surfaces of the moving strip.

It is understood that variations to the above combinations could be permitted while still attaining a desired product. For example, a coating solution having a specific gravity other than one within the ranges described may require a different rate of withdrawal of the strip from the coating tank. Additionally, this may in turn require a change in the height of the heater assemblies. It also may be required to increase the withdrawal rate substantially above the range described. This in turn would require either an increase in the heat output for the heater assemblies, or possibly lowering them and thereby reducing dimension h. For all intended purposes, however, Applicants prefer the combination of distances, formulations, and ranges as disclosed in this specification to achieve a uniformly coated article.

After passing through heater assemblies 73, strip 25, which now has a dried coating thereon, passes over roller 75. Roller 75, as will be further described in FIG. 4, may be an adjustable roller for taking up possible slack in strip 25 or for aligning the strip to assure a relatively straight path of movement through apparatus 10. This alignment procedure will also be more adequately described with the description of FIG. 4. An important point to remember regarding roller 75 and all rollers engaging strip 25 after the coating has dried thereon is that these rollers must be coated with a resilient material to thereby eliminate the possibility of marring or similar disfigurement to the surface of the coating as the strip passes thereover. Applicants utilize either teflon or rubber coated rollers at this position as well as for those in take-up means 21. Rollers engaging strip 25 before the coating material has been applied need not be coated with resilient material and may be either of steel or similar metallic composition.

From roller 75, strip 25 is drawn to take-up means 21. A take-up control station 77 operates in conjunction with power driven spool 79 to provide a means whereby strip 25 is accumulated after passing through the coating apparatus. Power for spool 79 is supplied by motor 81 immediately adjoining spool 79 and mechanically joined thereto by belt 83.

Figure 2:
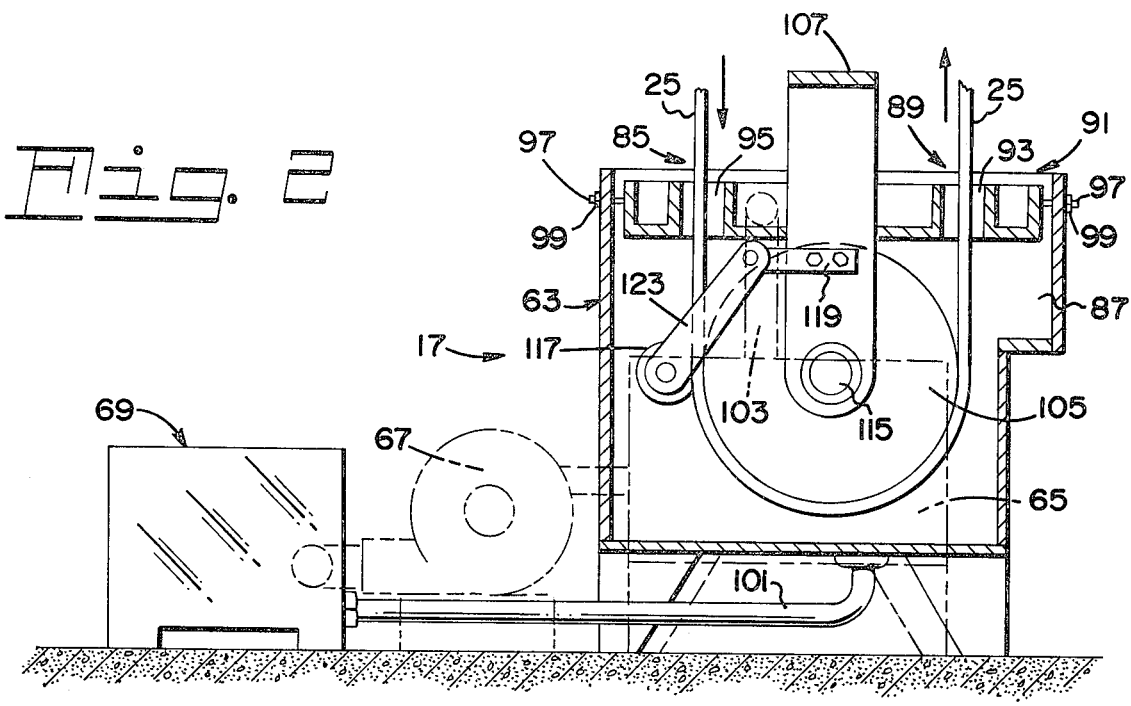
FIG. 2 is a side elevational view of the coating means employed in one embodiment of the present invention.
Figure 3:
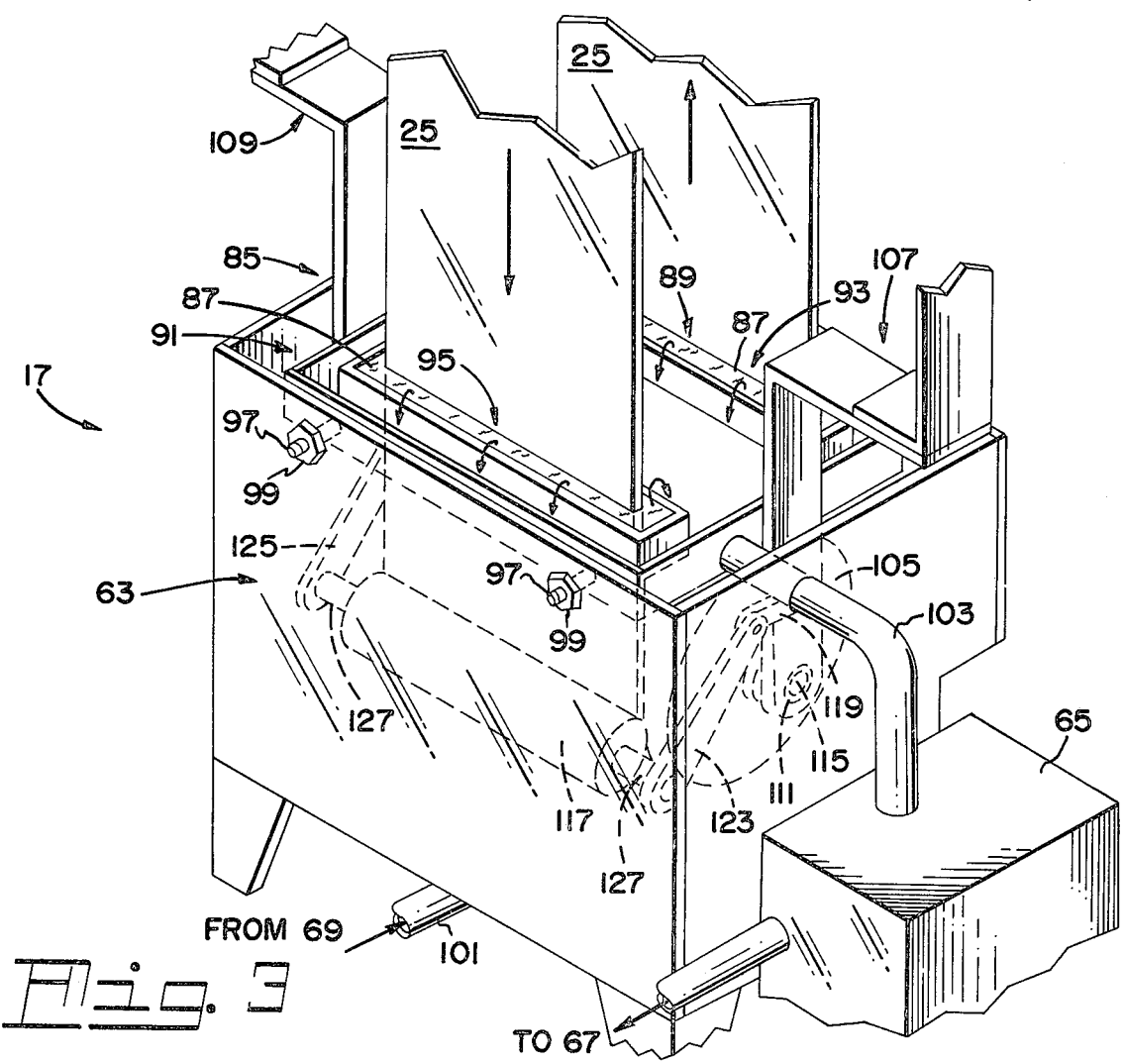
FIG. 3 is an isometric view of the coating means as illustrated in FIG. 2.

With particular reference to FIGS. 2 and 3, there is illustrated the coating means 17 of the present invention. Means 17 is shown to comprise a tank assembly 63, overflow reservoir 65 (shown in phamtom in FIG. 2), circulatory means 67 (shown in phantom in FIG. 2) and filtering means 69. Additionally, coating means 17 comprises a submerging means 85 for submerging strip 25 within coating material 87 in tank assembly 63 and an agitating means 89 for continuously agitating the surface of coating material 87 in the immediate area surrounding strip 25 as it is withdrawn from coating material 87. Positioned within tank assembly 63 is a tray member 91 which has a pair of troughlike openings 93 and 95 therein. Tray 91 is rigidly affixed within tank 63 by a plurality of adjusting screws 97 which protrude through the walls of tank 63 and into the sides of the tray. Each of screws 97 has a retaining nut 99 thereon for adjusting the tension on the screw and against the wall of the tank assembly. In FIGS. 2 and 3, tray member 91 is illustrated as having two troughlike openings, one at the position of entrance of the strip into the coating material and the other at the position of exit. For intended purposes, however, only one troughlike opening is essential — that being the one located near the exiting area of the strip. This is primarily necessary because of the residue or similar undesirable material buildup which would occur on a relatively stable surface of coatings of this particular variety. As will be explained, troughlike opening 93 is continuously supplied with an agitated surface and thereby prohibits any possible buildup as previously described. Opening 95 is also included, though not altogether necessary, to assure a residue free area surrounding the strip at the entrance position into the coating solution. It is remotely possible that residue could adhere to the incoming strip at this point, be carried down into tank 63, and thereafter become a part of the coating on the strip. This would consequently produce a flaw in the coating and result in an unsatisfactory article. The purpose of opening 93 is primarily to prohibit such a possible buildup on the surface of strip 25 as the strip exits the coating means and proceeds upward to the heater assemblies. Again, as can be readily understood, a flaw in the coating would be the end result.

providing the continuously agitated surface at openings 93 and 95 is accomplished by circulatory means 67, in this case a standard artificial pump, which forces coating material continuously through a piping arrangement interconnecting the pump and the tank assembly. More specifically, pump 67 forces coating material 87 through a filtering means 69 to remove any possible residue and then through pipe 101 into the bottom of tank assembly 63. Material 87 is forced upward to overflow the provided troughlike openings 93 and 95 while still not spilling over the walls of tank 63, which are substantially higher than the sides of tray 91. The overflow of material 87 exits tank 63 via pipe 103 and thereafter into overflow reservoir 65 where it is recycled by pump 67. As can be appreciated, overflow reservoir 65 and filtering means 69 are not essential to providing the continuously agitated surface and may therefore be eliminated from the circulatory system. If this is preferred, pump 67 can be directly connected to tank 63 and recirculate material 87 thereto.

Submerging means 85 is shown in FIGS. 2 and 3 as comprising a roller member 105 substantially submerged in coating material 87. Strip 25 engages roller 105 and is therefore assured of complete submergence in material 87. Roller 105 is aligned within tank 63 by a frame assembly having two support arms 107 and 109. A secondary roller 117 can also be included in submerging means 85. Roller 117, located on the side of roller 105 first engaging strip 25, has proven to be of substantial assistance in assuring a uniform coating to both sides of strip 25 by applying a lateral pressure against the newly deposited coating. It iss believed that this lateral pressure, in addition to that pressure provided by larger roller 105, effectively forces coating material 87 against both surfaces of strip 25 with substantial force to increase the adhering ability of the coating on these surfaces. This is not to be construed as a restrictive factor regarding the present invention, however, because suitable coatings are attained on strip 25 without employing a secondary roller. However, as noted, utilization of roller 117 has resulted in coatings having increased adhering ability. Roller 117 is attached to submerging means 85 by a pair of brackets 119 and 121 (not shown) which in turn have a pair of swing arms 123 and 125 rotatably joined thereto. Arms 123 and 125 each have a bearing positioned at one end therein for holding center shaft 127 of roller 117. To increase the aforedescribed lateral pressure exerted against strip 25, additional weight can be added to roller 171 by affixing such weights to arms 123 and 125 respectively. Conversely, a roller of heavier material could also be employed.

With reference to FIG. 4, there is illustrated an alignment means 129 for assuring a relatively straight path of movement of strip 25 through apparatus 10. As noted, a particularly desirable position for alignment means 129 is at the top of drying chamber 71, thereby utilizing roller 75. As strip 25 passes over roller 75, it occasionally has a tendency to move laterally (in direction $a$ or $b$) with the direction of forward movement of the strip. As can be appreciated, should strip 25 move laterally to such an extent that it entirely or even partially slips off roller 75, severe damage to the strip and components of apparatus 10 would occur. Therefore, strip 25 is maintained in a relatively straight forward direction of movement with minimal lateral deflection by aligning means 129, which comprises an adjusting mechanism 131 movably affixed to a second opposing end 133 of roller 75. In turn, first opposing end 135 of roller 75 is rotatably affixed to movable bearing 137. Adjusting mechanism 131 is indirectly actuated by electrical switch 139 which has a movable contact arm 142 affixed thereto which in turn is continually in contact with an edge of strip 25. Accordingly, switch 139 is electrically connected to a valving mechanism (not shown) which in turn control a fluid means (not shown) for supplying fluid to opposing ends of a cylindrical actuator 140 to force movement of connecting rod 141 in either the $m$ or $n$ direction. Because the valving means and fluid means as described are common in the art, it is not felt necessary to illustrate them here. Additionally, it is remembered that any of the components illustrated for aligning means 129 may be adequately substituted by similar functioning components and still retain the desired results.

As strip 25 moves laterally to a position as illustrated in phantom (direction $a$), moveable arm 142 is moved to position $y$ thereby actuating adjusting mechanism 131 to move end 133 in the direction as denoted by $n$. This movement provides for greater pressure by roller 75 against strip 25 on the side of the roller toward end 133. Increased pressure in this area substantially increases the adherence between strip and roller at this point and consequently moves strip 25 laterally in direction $b$. Conversely, if strip 25 moves laterally far enough in direction $b$ to permit arm 142 to reach the $x$ position, switch 139 again actuates mechanism 131, moving second opposing end 133 in the $m$ direction. This results in greater adherence between strip and roller on the end of roller 75 toward first opposing end 135, causing the strip to be moved laterally in the $a$ direction. In actuality, strip 25 continually moves laterally throughout the coating operation, though for only minimal distances at a time.

Thus, there has been shown and described a method for applying and drying a relatively thin uniform coating to both sides of a substantially horizontally aligned moving metallic strip.

While there have been shown and described what are at present considered the preferred embodiments of the invention, it will be obvious to those skilled in the art that various changes and modifications may be made thereof without departing from the scope of the invention as defined by the appended claims.

What is claimed is:

1. A method for simultaneously applying a relatively thin coating of photosensitive material sensitized by a dichromate ion to both sides of a substantially horizontally aligned metallic strip for utilization in aperture masks for color television cathode ray tubes and for drying said material thereon, said method comprising:

continuously supplying a moving substantially horizontally aligned metallic strip along a predetermined path;

applying a relatively thin coating of photosensitive material to both sides of said metallic strip by substantially submerging said strip within a tank assembly having said photosensitive material therein;

overflowing said tank assembly to continuously agitate the surface of said photosensitive material in the area immediately surrounding said metallic strip as said strip exits said tank assembly in a substantially vertical direction;

withdrawing said metallic strip from said tank assembly at a predetermined rate in a substantially vertical direction;

drying said photosensitive material on said strip; and accumulating said metallic strip after said photosensitive material has dried thereon.

2. The method according to claim 1 wherein said photosensitive material is dichromated glue.

3. The method according to claim 2 wherein said dichromated glue has a specific gravity ranging essentially from about 0.962 to about 1.040.

* * * * *